US012813030B2

(12) United States Patent
Kim et al.

(10) Patent No.: US 12,813,030 B2
(45) Date of Patent: Nov. 24, 2026

(54) DISPLAY DEVICE INCLUDING COLOR CONVERSION SUBSTRATE AND BANK LAYER HAVING DIFFERENT THICKNESS PORTIONS

(71) Applicant: Samsung Display Co., LTD., Yongin-si (KR)

(72) Inventors: Kanguk Kim, Yongin-si (KR); Min-Uk Kim, Yongin-si (KR); Kwang-Min Lee, Yongin-si (KR); Junhwi Lim, Yongin-si (KR); Kang Soo Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 18/495,132

(22) Filed: Oct. 26, 2023

(65) Prior Publication Data

US 2024/0222572 A1 Jul. 4, 2024

(30) Foreign Application Priority Data

Jan. 4, 2023 (KR) ........................ 10-2023-0001123

(51) Int. Cl.
*H10H 20/851* (2025.01)
*H10H 20/855* (2025.01)
*H10W 90/00* (2026.01)

(52) U.S. Cl.
CPC ...... *H10H 20/8512* (2025.01); *H10H 20/855* (2025.01); *H10W 90/00* (2026.01)

(58) Field of Classification Search
CPC . H10H 20/8512; H10H 20/855; H10W 90/00; H10K 59/122; H10K 59/127;
(Continued)

(56) References Cited

U.S. PATENT DOCUMENTS

2021/0005672 A1* 1/2021 Lee .................... H10K 59/8792
2021/0193742 A1* 6/2021 Kim ....................... H10K 59/38

FOREIGN PATENT DOCUMENTS

CN 113437119 9/2021
KR 10-2007-0049172 5/2007
(Continued)

OTHER PUBLICATIONS

Office Action dated Jul. 27, 2026 from the Korean Intellectual Property Office (KIPO) for Korean Patent Application No. 10-2023-0001123, 20 pages.

*Primary Examiner* — Anne M Hines
*Assistant Examiner* — Jose M Diaz
(74) *Attorney, Agent, or Firm* — CANTOR COLBURN LLP

(57) ABSTRACT

A display device includes a first light emitting element diode and a second light emitting diode which are disposed on a first base substrate, a bank layer disposed under a second base substrate facing the first base substrate, including a first opening overlapping the first light emitting diode in a plan view and a second opening overlapping the second light emitting diode in a plan view, and having a first part and a second part, a transmitting layer disposed inside the first opening, and a first color conversion layer disposed inside the second opening. The first part and the second part have different thicknesses in a thickness direction of the second base substrate.

20 Claims, 17 Drawing Sheets

(58) Field of Classification Search
CPC .... H10K 59/38; H10K 59/873; H10K 59/877; H10K 59/879; H10K 59/88
See application file for complete search history.

(56) References Cited

FOREIGN PATENT DOCUMENTS

| | | | |
|---|---|---|---|
| KR | 20210129786 | A | 10/2021 |
| KR | 20210158461 | A | 12/2021 |
| KR | 20220088541 | A | 6/2022 |

* cited by examiner

DISPLAY DEVICE INCLUDING COLOR CONVERSION SUBSTRATE AND BANK LAYER HAVING DIFFERENT THICKNESS PORTIONS

CROSS REFERENCE TO RELATED APPLICATION(S)

This application claims priority to and benefits of Korean Patent Application No. 10-2023-0001123 under 35 U.S.C. § 119, filed on Jan. 4, 2023, in the Korean Intellectual Property Office (KIPO), the entire contents of which are incorporated herein by reference.

BACKGROUND

1. Technical Field

Embodiments relate to a display device including a color conversion substrate.

2. Description of the Related Art

A display device is a device that displays an image for providing visual information to a user. Among display devices, an organic light emitting diode display has recently attracted attention.

Recently, in order to improve display quality, a display device including a display part having multiple pixels and a color filter part having a color filter layer and a color conversion layer has been proposed. The color conversion layer may convert a wavelength of light provided from the display part. Accordingly, the display device including the color conversion layer may emit light having a color. The color of the color conversion layer included in the display device and a color of incident light may be different from each other. For example, the color conversion layer may include wavelength conversion particles such as quantum dots or the like.

Meanwhile, column spacers may be placed to maintain a gap (or a distance) between the display part and the color filter part.

SUMMARY

The disclosure provides a display device with improved display quality.

A display device according to an embodiment may include a first light emitting element diode and a second light emitting diode which are disposed on a first base substrate, a bank layer disposed under a second base substrate facing the first base substrate, including a first opening overlapping the first light emitting diode in a plan view and a second opening overlapping the second light emitting diode in a plan view, and having a first part and a second part, a transmitting layer disposed inside the first opening, and a first color conversion layer disposed inside the second opening. The first part and the second part may have different thicknesses in a thickness direction of the second base substrate.

In an embodiment, a thickness of the first part may be greater than a thickness of the second part in the thickness direction.

In an embodiment, the first part may be disposed adjacent to the first opening.

In an embodiment, the bank layer may further include a dummy opening, and the second part may be disposed adjacent to the dummy opening.

In an embodiment, the transmitting layer may cover the first part and a lower surface of the second part.

In an embodiment, the transmitting layer may include a scatterer.

In an embodiment, the scatterer may include titanium dioxide ($TiO_2$).

In an embodiment, the first color conversion layer may include a wavelength conversion particle.

In an embodiment, the display device may further include a color filter layer disposed under the second base substrate.

In an embodiment, the display device may further include a low refractive layer disposed between the color filter layer and the bank layer.

In an embodiment, the display device may further include a capping layer disposed between the low refractive layer and the bank layer.

A display device according to another embodiment may include a first light emitting diode, a second light emitting diode, and a third light emitting diode which are disposed on a first base substrate, a bank layer disposed under a second base substrate facing the first base substrate, and including a first opening overlapping the first light emitting diode in a plan view, a second opening overlapping the second light emitting diode in a plan view, and a third opening overlapping the third light emitting diode in a plan view, a transmitting layer disposed inside the first opening, a first color conversion layer disposed inside the second opening, and a second color conversion layer disposed inside the third opening. A thickness of the bank layer disposed adjacent to the first opening and a thickness of the bank layer disposed adjacent to the third opening may be different from each other in a thickness direction of the second base substrate.

In an embodiment, the thickness of the bank layer disposed adjacent to the first opening may be greater than the thickness of the bank layer disposed adjacent to the third opening.

In an embodiment, the transmitting layer may cover a portion of a lower surface of the bank layer disposed adjacent to the first opening.

In an embodiment, the transmitting layer may include a scatterer.

In an embodiment, the scatterer may include titanium dioxide ($TiO_2$).

In an embodiment, the first color conversion layer may include a first wavelength conversion particle, and the second color conversion layer may include a second wavelength conversion particle.

In an embodiment, the display device may further include a color filter layer disposed under the second base substrate.

In an embodiment, the display device may further include a low refractive layer disposed between the color filter layer and the bank layer.

In an embodiment, the display device may further include a capping layer disposed between the low refractive layer and the bank layer.

As the height of the first part is greater than the height of the second part, the first part may function as a column spacer. Accordingly, a gap between the display substrate and the color conversion substrate may be secured by the first part without having the column spacer. As the display device does not include the column spacer, a pitch between pixels may be narrowed, and a resolution of the display device may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
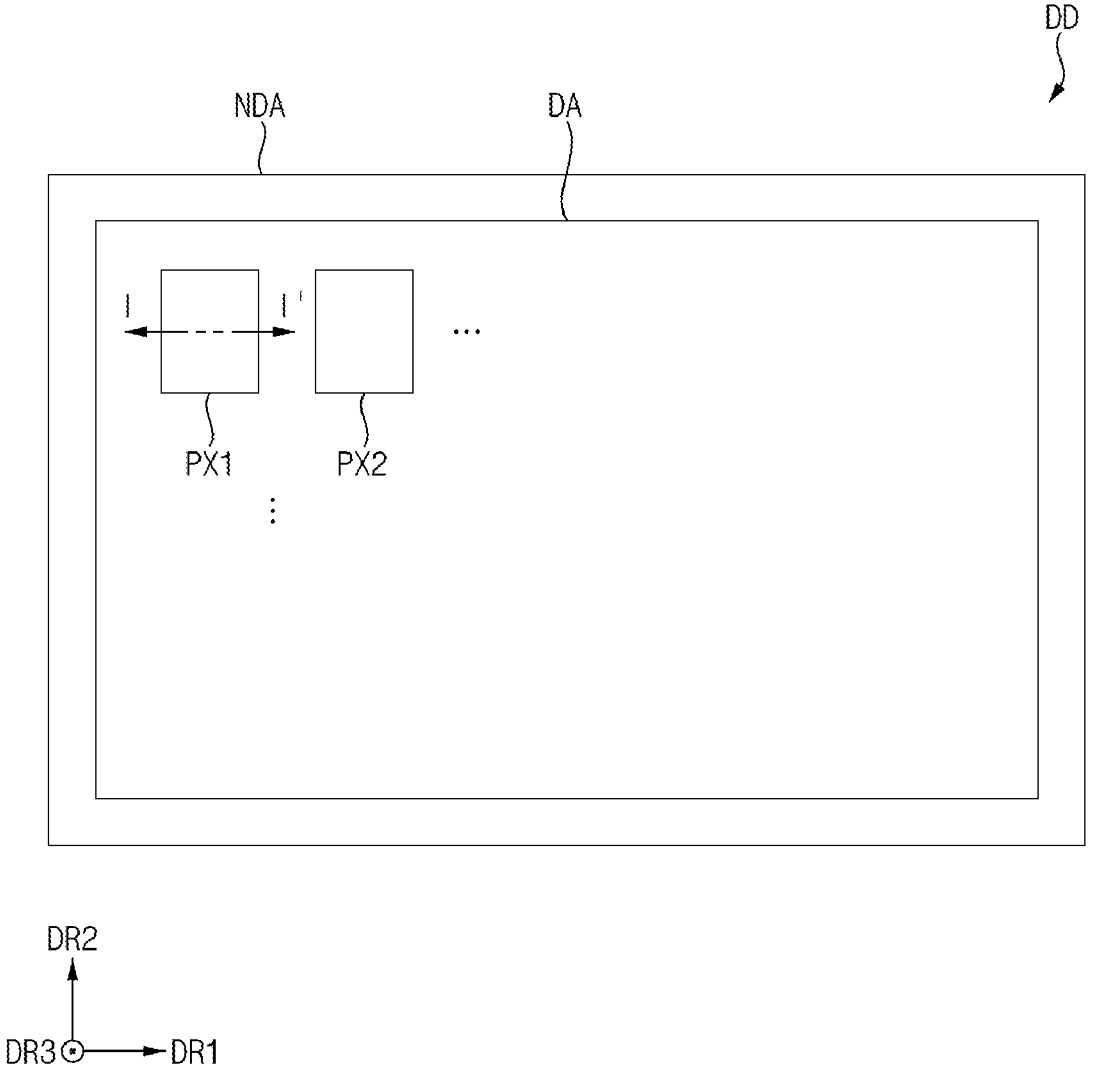
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

When an element, such as a layer, film, region, or substrate is referred to as being "on," "connected to," or "coupled to" another element, it may be directly on, connected to, or coupled to the other element or intervening elements may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" may be construed as X only, Y only, Z only, or any combination of two or more of X, Y, and Z, such as, for instance, XYZ, XYY, YZ, and ZZ.

It will be understood that when an element such as a layer, film, region, or substrate is referred to as being "on" or "over" another element, it can be directly on the other element or intervening element(s) may also be present. In contrast, when an element is referred to as being "directly on" another element, no intervening elements are present.

Spatially relative terms, such as "under," "lower," "upper," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

When a component is described herein to "connect" another component to the other component or to be "connected to" other components, the components may be connected to each other as separate elements, or the components may be integral with each other. Also, throughout the specification, when an element is referred to as being "connected" to another element, the element may be "directly connected" to another element, or "electrically connected" to another element with one or more intervening elements interposed therebetween.

As customary in the field, some embodiments are described and illustrated in the accompanying drawings in terms of functional blocks and/or units. Those skilled in the art will appreciate that these blocks and/or units are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks and/or units being implemented by microprocessors or other similar hardware, they may be programmed and controlled using software (e.g., microcode)

to perform various functions discussed herein and may optionally be driven by firmware and/or software. It is also contemplated that each blocks and/or units may be implemented by dedicated hardware, or as a combination of dedicated hardware to perform some functions and a processor (e.g., one or more programmed microprocessors and associated circuitry) to perform other functions. Also, each blocks and/or units of some example embodiments may be physically separated into two or more interacting and discrete blocks and/or units without departing from the scope of the disclosure. Further, the blocks and/or units of some example embodiments may be physically combined into more complex blocks and/or units without departing from the scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, display devices in accordance with embodiments will be described in more detail with reference to the accompanying drawings. The same reference numerals are used for the same components in the drawings, and redundant descriptions of the same components will be omitted.

FIG. 1 is a schematic plan view illustrating a display device according to an embodiment.

Referring to FIG. 1, a display device DD according to an embodiment may include a display area DA and a non-display area NDA.

Multiple pixels may be disposed in the display area DA. Each of the pixels may emit light. For example, the pixels may include a first pixel PX1 and a second pixel PX2. The first pixel PX1 and the second pixel PX2 may simultaneously emit light. In another embodiment, in case that the first pixel PX1 emits light, the second pixel PX2 may not emit light. In another embodiment, in case that the first pixel PX1 does not emit light, the second pixel PX2 may emit light. As each of the pixels emits light, the display area DA may display an image.

The pixels may be repeatedly arranged in a first direction DR1 and a second direction DR2 intersecting the first direction DR1 in a plan view. For example, the second pixel PX2 may be disposed adjacent to the first pixel PX1. The second pixel PX2 may be disposed adjacent to the first pixel PX1 in the first direction DR1.

The non-display area NDA may be located adjacent to the display area DA. For example, the non-display area NDA may surround at least a portion of the display area DA. A driving part may be disposed in the non-display area NDA. The driving part may provide a signal or a voltage to the pixels. For example, the driving part may include a data driving part, a gate driving part, and/or the like. The non-display area NDA may not display an image.

In specification, a plane may be defined by the first direction DR1 and the second direction DR2, and for example, the first direction DR1 and the second direction DR2 may be perpendicular to each other. A third direction DR3 may be perpendicular to each of the first direction DR1 and the second direction DR2.

Figure 2:
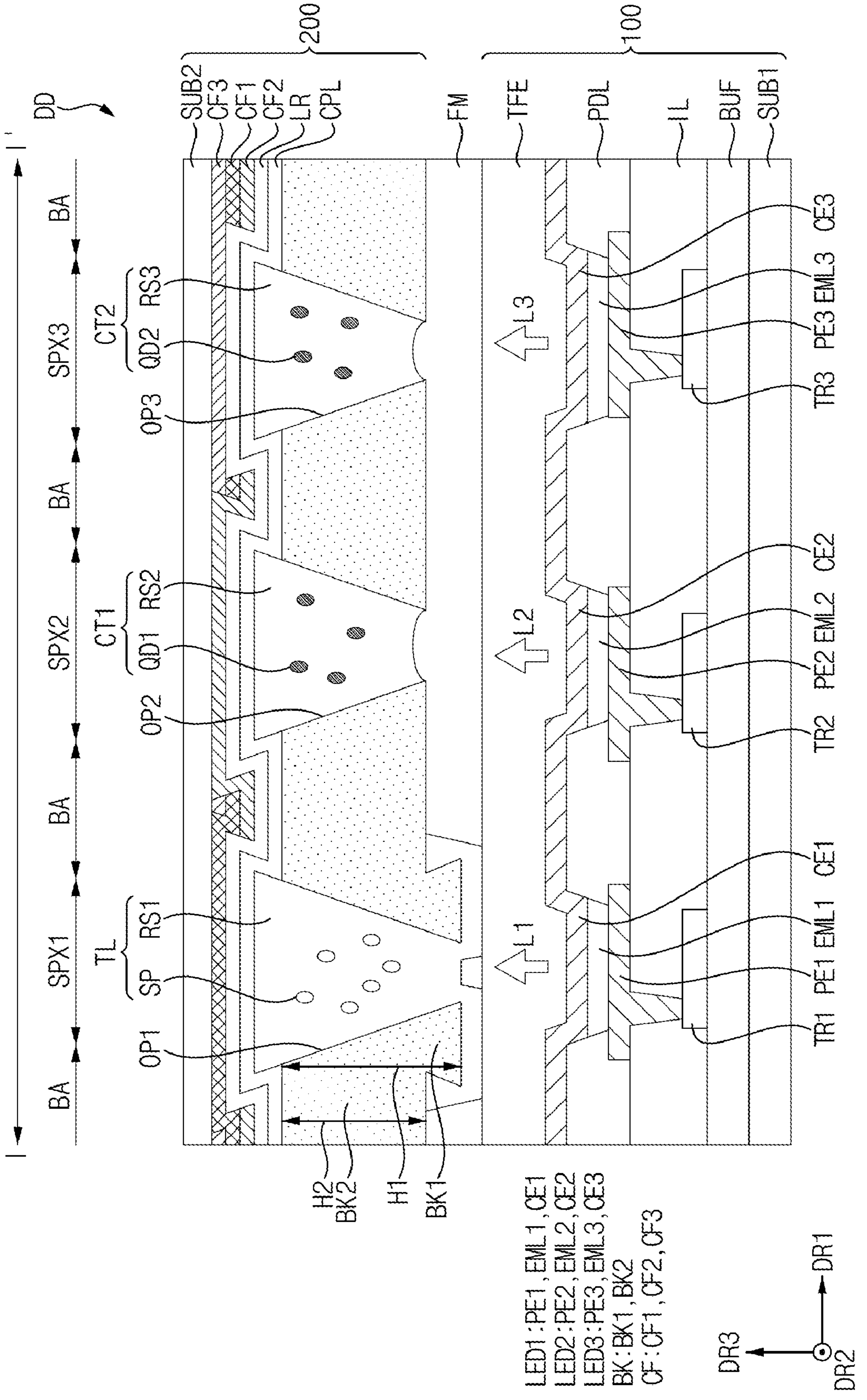
FIG. 2 is a schematic cross-sectional view illustrating the display device of FIG. 1.

FIG. 2 is a schematic cross-sectional view illustrating the display device of FIG. 1.

Referring to FIG. 2, the display device DD may include a display part 100, a color filter part 200, and a filler FM. The display part 100 may include a first base substrate SUB1, a buffer layer BUF, an insulation layer IL, a pixel defining layer PDL, an encapsulation layer TFE, a first pixel electrode PE1, a first light emitting layer EML1, a first common electrode CE1, a second pixel electrode PE2, a second light emitting layer EML2, a second common electrode CE2, a third pixel electrode PE3, a third light emitting layer EML3, a third common electrode CE3, a first transistor TR1, a second transistor TR2, and a third transistor TR3.

The first transistor TR1 may include a first active pattern, a first gate electrode, a first source electrode, and a first drain electrode, the second transistor TR2 may include a second active pattern, a second gate electrode, a second source electrode, and a second drain electrode, and the third transistor TR3 may include a third active pattern, a third gate electrode, a third source electrode, and a third drain electrode.

The first base substrate SUB1 may include a transparent material or an opaque material. The first base substrate SUB1 may be formed of a transparent resin substrate. For example, the transparent resin substrate may be a polyimide substrate or the like. The polyimide substrate may include a first organic layer, a first barrier layer, a second organic layer, or the like.

In another embodiment, the first base substrate SUB1 may be a quartz substrate, a synthetic quartz substrate, a calcium fluoride substrate, a fluorine-doped quartz substrate, a soda-lime substrate, a non-alkali glass substrate, the like, or a combination thereof.

The buffer layer BUF may be disposed on the first base substrate SUB1. The buffer layer BUF may prevent metal atoms or impurities from diffusing from the first base substrate SUB1 to the first to third transistors TR1, TR2, and TR3. The buffer layer BUF may improve a flatness of a surface of the first base substrate SUB1 in case that the surface of the first base substrate SUB1 is not uniform.

For example, the buffer layer BUF may include an inorganic material such as silicon oxide ($SiO_x$), silicon nitride ($SiN_x$), silicon oxynitride ($SiO_xN_y$), the like, or a combination thereof.

The first to third transistors TR1, TR2, and TR3 may be disposed on the buffer layer BUF. For example, each of the first to third transistors TR1, TR2, and TR3 may include polycrystalline silicon, metal oxide semiconductor, the like, or a combination thereof.

The metal oxide semiconductor may include a binary compound ("$AB_x$"), a ternary compound ("$AB_xC_y$"), a quaternary compound ("$AB_xC_yD_z$"), or the like, which include indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), the like, or a combination thereof.

The insulating layer IL may be disposed on the buffer layer BUF. The insulating layer Il may be disposed on the buffer layer BUF and the first to third transistors TR1, TR2, and TR3. The insulating layer IL may cover the first to third transistors TR1, TR2, and TR3. The insulating layer IL may include at least one inorganic insulating layer and at least one organic insulating layer.

For example, the inorganic insulating layer may include silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), the like, or a combination thereof.

The organic insulating layer may include a photoresist, a polyacryl-based resin, a polyimide-based resin, a polyamide-based resin, a siloxane-based resin, an acrylic-based resin, an epoxy-based resin, the like, or a combination thereof.

The first pixel electrode PE1, the second pixel electrode PE2, and the third pixel electrode PE3 may be disposed on the insulating layer IL. The first to third pixel electrodes PE1, PE2, and PE3 may be disposed in first to third light emitting areas SPX1, SPX2, and SPX3, respectively. The first to third pixel electrodes PE1, PE2, and PE3 may be connected to the first to third transistors TR1, TR2, and TR3, respectively through contact holes formed by removing a portion of the insulating layer IL.

For example, each of the first to third pixel electrodes PE1, PE2, and PE3 may include a metal, an alloy, a metal nitride, a conductive metal oxide, a transparent conductive material, the like, or a combination thereof. For example, each of the first to third pixel electrodes PE1, PE2, and PE3 may operate as an anode.

The pixel defining layer PDL may be disposed on the insulating layer IL and the first to third pixel electrodes PE1, PE2, and PE3. The pixel defining layer PDL may be disposed in a non-light emitting area BA. The pixel defining layer PDL may cover both sides of each of the first to third pixel electrodes PE1, PE2, and PE3 and may expose at least a portion of upper surfaces of the first to third pixel electrodes PE1, PE2, and PE3.

The pixel defining layer PDL may include an organic material and/or an inorganic material. In an embodiment, the pixel defining layer PDL may include an organic material. For example, the pixel defining layer PDL may include a photoresist, a polyacrylic resin, a polyimide resin, a polyamide resin, a siloxane resin, an acrylic resin, an epoxy resin, the like, or a combination thereof.

The first to third light emitting layers EML1, EML2, and EML3 may be disposed on the first to third pixel electrodes PE1, PE2, and PE3, respectively. The first to third light emitting layers EML1, EML2, and EML3 may be disposed in the first to third light emitting areas SPX1, SPX2, and SPX3, respectively.

For example, holes provided from the first to third pixel electrodes PE1, PE2, and PE3 and electrons provided from the first to third common electrodes CE1, CE2, and CE3 may be combined in the first to third light emitting layers EML1, EML2, and EML3, respectively to form exciton. As the exciton changes from an excitation state to a ground state, the first to third light emitting layers EML1, EML2, and EML3 may emit light.

The first to third common electrodes CE1, CE2, and CE3 may be disposed on the first to third light emitting layers EML1, EML2, and EML3 and the pixel defining layer PDL. For example, each of the first to third common electrodes CE1, CE2, and CE3 may include a metal, an alloy, a metal nitride, a conductive metal oxide, a transparent conductive material, the like, or a combination thereof. For example, each of the first to third common electrodes CE1, CE2, and CE3 may operate as a cathode. In an embodiment, the first to third common electrodes CE1, CE2, and CE3 may be integral with each other.

The first pixel electrode PE1, the first light emitting layer EML1, and the first common electrode CE1 may constitute a first light emitting diode LED1. The second pixel electrode PE2, the second light emitting layer EML2, and the second common electrode CE2 may constitute a second light emitting diode LED2. The third pixel electrode PE3, the third light emitting layer EML3, and the third common electrode CE3 may constitute a third light emitting diode LED3.

The encapsulation layer TFE may be disposed on the first to third common electrodes CE1, CE2, and CE3. The encapsulation layer TFE may prevent impurities and moisture from penetrating into the first to third light emitting diode LED1, LED2, and LED3 from an outside.

The encapsulation layer TFE may include at least one inorganic encapsulation layer and at least one organic encapsulation layer. For example, the inorganic encapsulation layer may include silicon oxide ("$SiO_x$"), silicon nitride ("$SiN_x$"), silicon oxynitride ("$SiO_xN_y$"), the like, or a combination thereof, and the organic encapsulation layer may include a polymer cured product such as polyacrylate or the like.

The color filter part 200 may include a color filter layer CF, a second base substrate SUB2, a low refractive layer LR, a capping layer CPL, and a bank layer BK.

The second base substrate SUB2 may include a transparent material. For example, the second base substrate SUB2 may include glass, a plastic, the like, or a combination thereof. A surface of the second base substrate SUB2 facing the first base substrate SUB1 may be defined as a lower surface.

The color filter layer CF may be disposed under the lower surface of the second base substrate SUB2. The color filter layer CF may include a first color filter CF1, a second color filter CF2, and a third color filter CF3.

In an embodiment, the first color filter CF1 may be disposed in the first light emitting area SPX1 and may selectively transmit blue light. The second color filter CF2 may be disposed in the second light emitting area SPX2 and may selectively transmit red light. The third color filter CF3 may be disposed in the third light emitting area SPX3 and may selectively transmit green light.

However, the disclosure is not limited thereto. For example, the second color filter CF2 may selectively transmit green light. The third color filter CF3 may selectively transmit red light.

In an embodiment, each of the first color filter CF1, the second color filter CF2, and the third color filter CF3 may be disposed in the non-light emitting area BA. For example, as shown in FIG. 2, the first color filter CF1 may be disposed in the first light emitting area SPX1 and the non-light emitting area BA, and may not be disposed in the second light emitting area SPX2 and third light emitting area SPX3. The second color filter CF2 may be disposed in the second light emitting area SPX2 and the non-light emitting area BA, and may not be disposed in the first light emitting area SPX1 and third light emitting area SPX3. The third color filter CF3 may be disposed in the third light emitting area SPX3 and the non-light emitting area BA, and may not be disposed in the first light emitting area SPX1 and second light emitting area SPX2.

In the non-light emitting area BA, a portion of each of the first color filter CF1, the second color filter CF2, and the third color filter CF3 may overlap each other in the third direction DR3. Accordingly, color mixing between adjacent ones of the first to third light emitting areas SPX1, SPX2, and SPX3 may be prevented.

The low refractive layer LR may be disposed under the color filter layer CF. The low refractive layer LR may be disposed under at least one of the first to third color filter layer CF1. CF2, and CF3. In an embodiment, the low refractive layer LR may include an organic material. The low refractive layer LR may increase a luminance and life of the display device DD by improving light extraction efficiency.

The capping layer CPL may be disposed under the low refractive layer LR. In an embodiment, the capping layer CPL may cover the low refractive layer LR. In an embodiment, the capping layer CPL may include an inorganic material. For example, the capping layer CPL may include silicon oxide ("$SiO_x$"), silicon nitride ("$SiN_x$"), the like, or a combination thereof.

Figure 3:
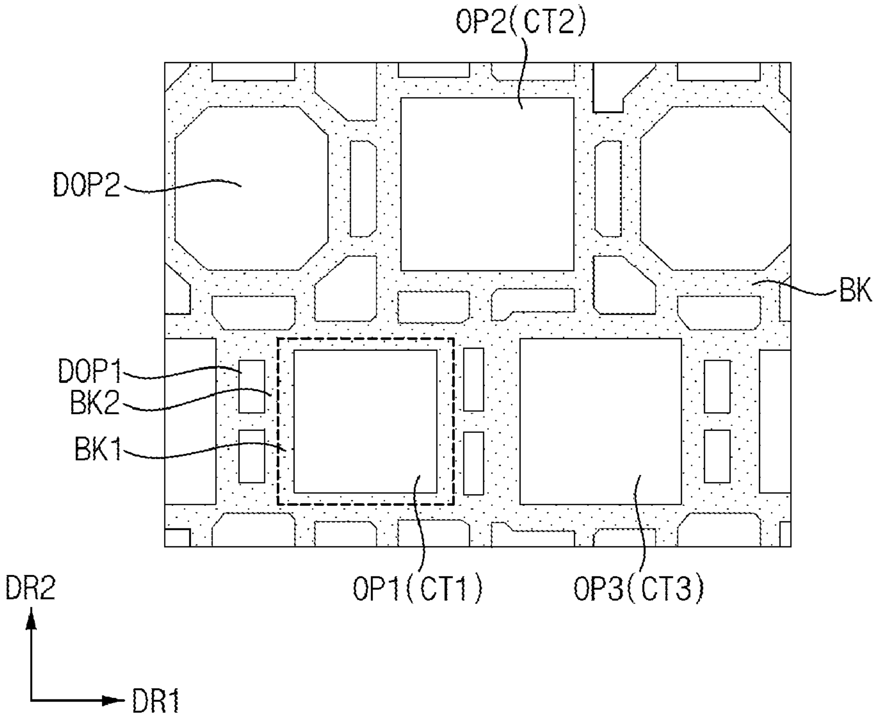
FIG. 3 is a schematic plan view illustrating a bank layer included in the display device of FIG. 2.

FIG. 3 is a schematic plan view illustrating a bank layer included in the display device of FIG. 2.

Referring to FIGS. 2 and 3, a bank layer BK may be disposed under the capping layer CPL. The bank layer BK may include a first opening OP1, a second opening OP2, and a third opening OP3 overlapping the first light emitting area SPX1, the second light emitting area SPX2, and the third light emitting area SPX3 in a plan view, respectively. For example, the bank layer BK may be disposed (e.g., be entirely disposed) in the non-light emitting area BA and may have a matrix shape in a plan view.

In an embodiment, each of the first to third openings OP1, OP2, and OP3 may have a rectangular shape in a plan view. However, the disclosure is not limited thereto. For example, each of the first to third openings OP1, OP2, and OP3 may have one of a circular shape, a triangular shape, a pentagonal shape, and a hexagonal shape in a plan view.

The bank layer BK may include a first dummy opening DOP1 and a second dummy opening DOP2. Each of the first dummy opening DOP1 and the second dummy opening DOP2 may accommodate ink that is impregnated by mistake during manufacturing of first and second color conversion layers CT1 and CT2 to be described below.

The bank layer BK may include a first part BK1 and a second part BK2. The first part BK1 may be disposed adjacent to (or around) the first opening OP1. For example, the first part BK1 may be disposed adjacent to the first opening OP1 and spaced apart from the first dummy opening DOP1 in the first direction DR1 and/or the second direction DR2.

The second part BK2 may be disposed adjacent to (or around) the first dummy opening DOP1. For example, the second part BK2 may be disposed between the first part BK1 and the first dummy opening DOP1.

In an embodiment, a height (or thickness) H1 of the first part BK1 may be greater than a height (or thickness) H2 of the second part BK2 in a thickness direction of the first base substrate SUB1. The height H2 of the second part BK2 and a height of the bank layer BK disposed adjacent to the second opening OP2 and the third opening OP3 may be the same in the thickness direction. Accordingly, a distance (or a gap) between the display part 100 and the color filter part 200 may be maintained constant by the first part BK1 and a transmitting layer TL to be described below.

A transmitting layer TL may be disposed inside the first opening OP1. For example, the transmitting layer TL may be disposed in the first light emitting area SPX1. For example, the transmitting layer TL may include a first resin part RS1 and a scatterer SP. The first resin part RS1 may include an epoxy-based resin, an acrylic resin, a phenol-based resin, a melamine-based resin, a cardo-based resin, an imide-based resin, the like, or a combination thereof.

The scatterer SP may increase a light path by scattering first incident light L1 without substantially converting a wavelength of the first incident light L1 incident on the transmitting layer TL. In an embodiment, the scatterer SP may include a metal oxide or an organic material. In an embodiment, the scatterer SP may include titanium dioxide ("$TiO_2$").

A surface of the first part BK1 facing the display part 100 may be defined as a lower surface. In an embodiment, the transmitting layer TL may cover the lower surface of the first part BK1. A surface of the second part BK2 facing the display part 100 may be defined as a lower surface. The transmitting layer TL may cover a portion of the lower surface of the second part BK2. Accordingly, the distance between the display part 100 and the color filter part 200 may be maintained constant by the first part BK1 and the transmitting layer TL disposed under the first part BK1. For example, the first part BK1 and the transmitting layer TL disposed under the first part BK1 may serve as a column spacer.

For example, even in case that the column spacer is removed, the gap between the display part 100 and the color filter part 200 of the display device DD according to an embodiment may be maintained constant. As the column spacer is removed and a pitch (or a gap) between the pixels is narrowed, a resolution of the display device DD may be improved. Accordingly, the display device DD according to an embodiment may have a structure suitable for a high-resolution display device. A space between the first color conversion layer CT1 and the second color conversion layer CT2 that may be disposed (or formed) by a inkjet process may be secured.

The first color conversion layer CT1 may be disposed inside the second opening OP2. For example, the first color conversion layer CT1 may be disposed in the second light emitting area SPX2. For example, the first color conversion layer CT1 may include a second resin part RS2 and a first wavelength conversion particle QD1. The second resin part RS2 and the first resin part RS1 may be substantially the same.

The first wavelength conversion particle QD1 may include quantum dot. The quantum dot may absorb second incident light L2 to emit light having a wavelength. The wavelength of the light emitted from the quantum dot and a wavelength of the second incident light L2 may be different from each other. In an embodiment, the first wavelength conversion particle QD1 may absorb the second incident light L2 to emit red light.

The red light emitted from the first wavelength conversion particle QD1 may pass through the second base substrate SUB2 and be emitted to an outside (i.e., in the third direction DR3). The second incident light L2, which is not converted by the first wavelength conversion particle QD1, may be blocked by the second color filter CF2. In an embodiment, the first color conversion layer CT1 may include a second scatterer (not shown).

The second color conversion layer CT2 may be disposed inside the third opening OP3. For example, the second color conversion layer CT2 may be disposed in the third light emitting area SPX3. For example, the second color conversion layer CT2 may include a third resin part RS3 and a second wavelength conversion particle QD2. The third resin part RS3 and the first resin part RS1 may be substantially the same. The third resin part RS3 and the second resin part RS2 may be substantially the same.

The second wavelength conversion particle QD2 may include quantum dot. The quantum dot may absorb the third incident light L3 to emit light having a wavelength. The wavelength of the light emitted in the quantum dot and a wavelength of the third incident light L3 may be different from each other. In an embodiment, the second wavelength conversion particle QD2 may absorb the third incident light L3 to emit green light.

The green light emitted from the second wavelength conversion particle QD2 may pass through the second base substrate SUB2 and be emitted to the outside (i.e., the third direction DR3). The third incident light L3, which is not converted by the second wavelength conversion particle QD2, may be blocked by the third color filter CF3. In an embodiment, the second color conversion layer CT2 may include a third scatterer (not shown).

A filler FM may be disposed between the display part 100 and the color filter part 200. For example, the filler FM may serve to bond (or laminate) the display part 100 and the color filter part 200. For example, the filler FM may include a urethane-based resin, an epoxy-based resin, an acrylic resin, the like, or a combination thereof.

FIGS. 4 to 10 are schematic cross-sectional views illustrating a method of manufacturing a color filter part included in the display device of FIG. 2.

Figure 4:
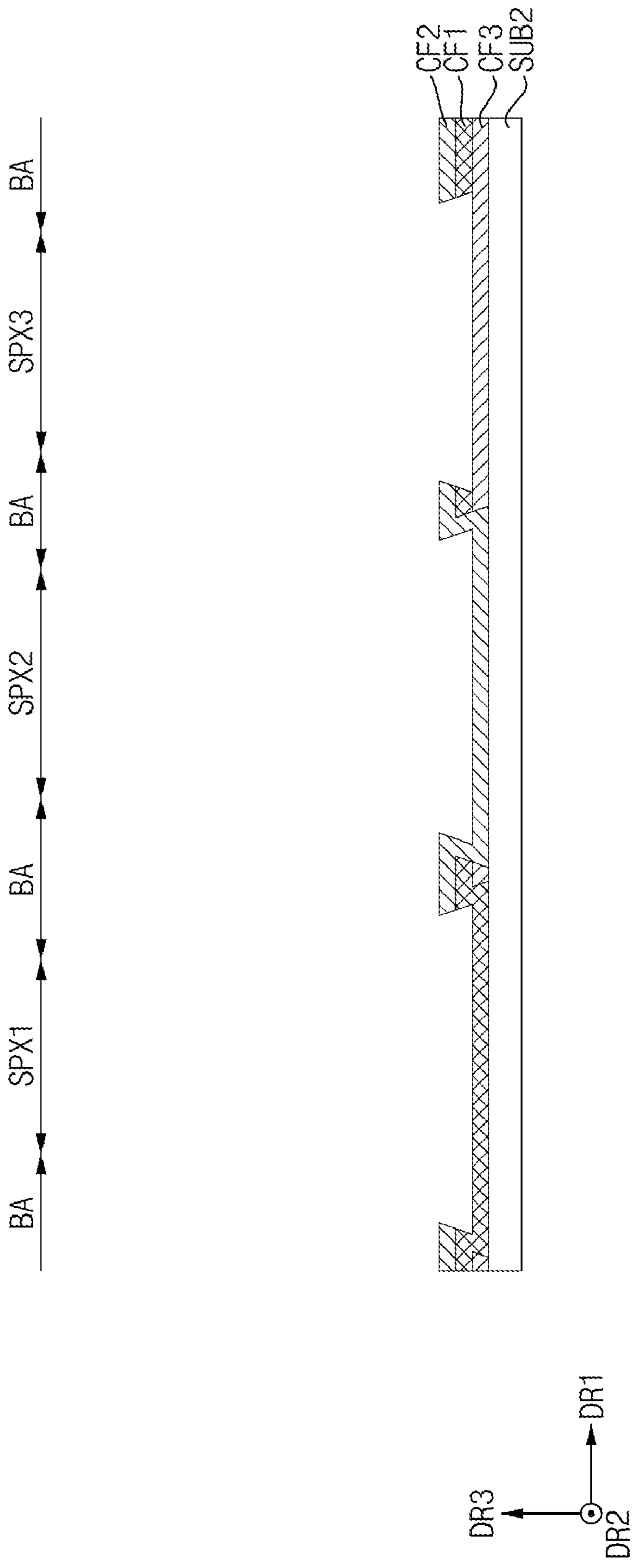
FIGS. 4 to 10 are schematic cross-sectional views illustrating a method of manufacturing a color filter part included in the display device of FIG. 2.

Referring to FIG. 4, a color filter layer CF may be formed on the second base substrate SUB2. At least one of a first color filter layer CF1, a second color filter layer CF2, and a third color filter layer CF3 may be formed on the second base substrate SUB2. The first color filter CF1 may be formed in the first light emitting area SPX1 and the non-light emitting area BA on the second base substrate SUB2. The second color filter CF2 may be formed in the second light emitting area SPX2 and the non-light emitting area BA on the second base substrate SUB2. The third color filter CF3 may be formed in the third light emitting area SPX3 and the non-light emitting area BA on the second base substrate SUB2.

Figure 5:
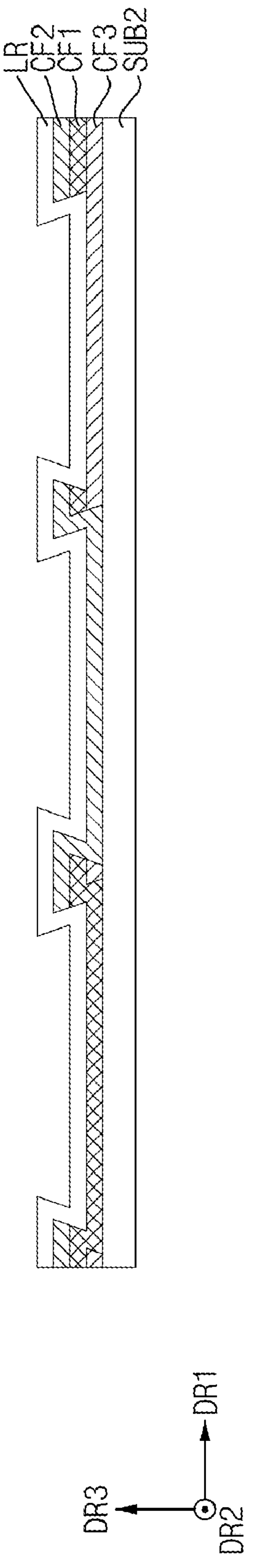

Referring to FIG. 5, a low refractive layer LR may be formed on the color filter layer CF. The low refractive layer LR may be formed on the at least one of the first color filter CF1, the second color filter CF2, and the third color filter CF3. The low refractive layer LR may be formed of an organic material.

Figure 6:
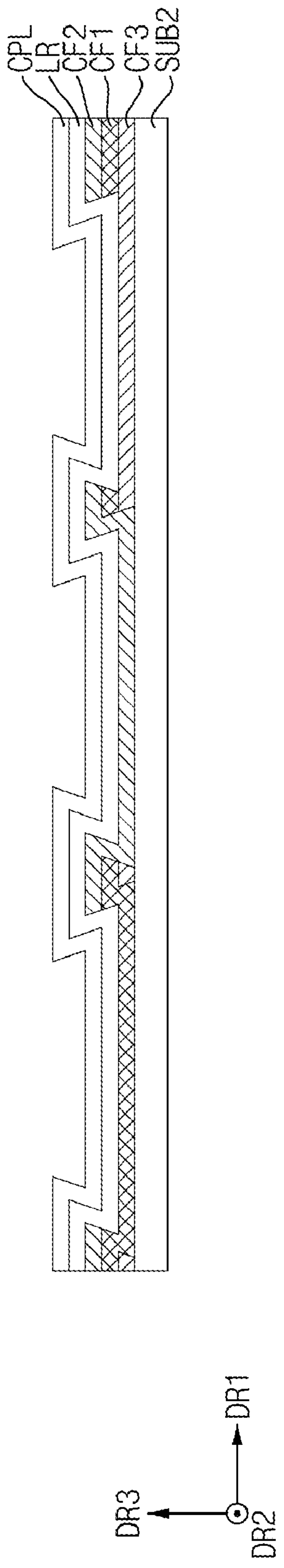

Referring to FIG. 6, a capping layer CPL may be formed on the low refractive layer LR. The capping layer CPL may be formed of an inorganic material.

Figure 7:
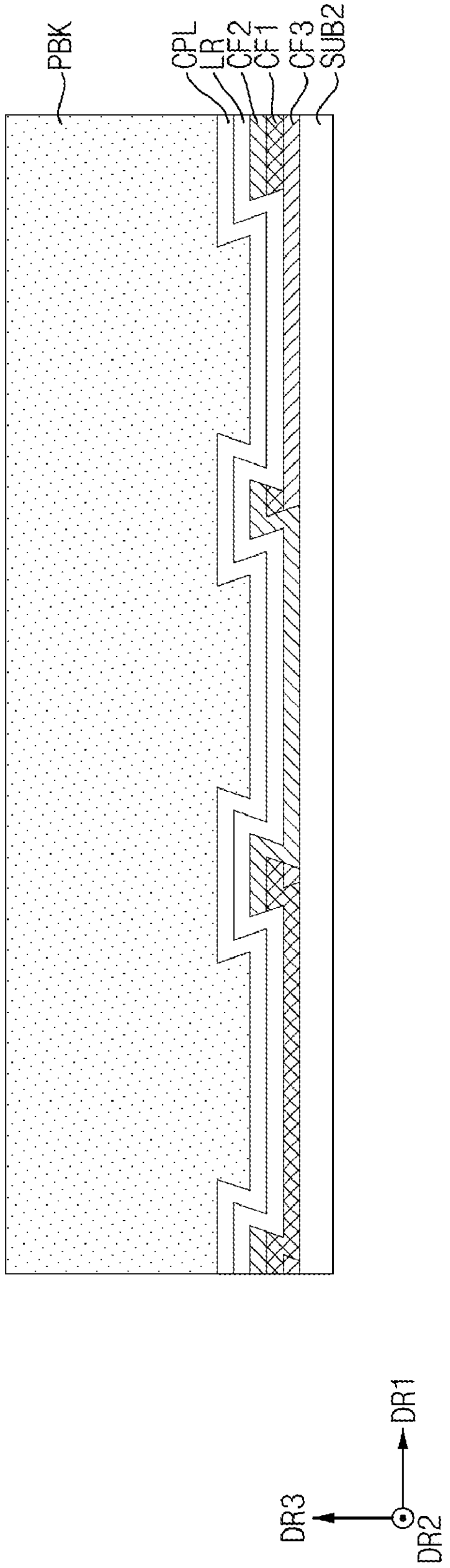

Referring to FIG. 7, a preliminary bank layer PBK may be formed on the capping layer CPL. The preliminary bank layer PBK may be formed of an organic material. The preliminary bank layer PBK may further include a light blocking material.

Figure 8:
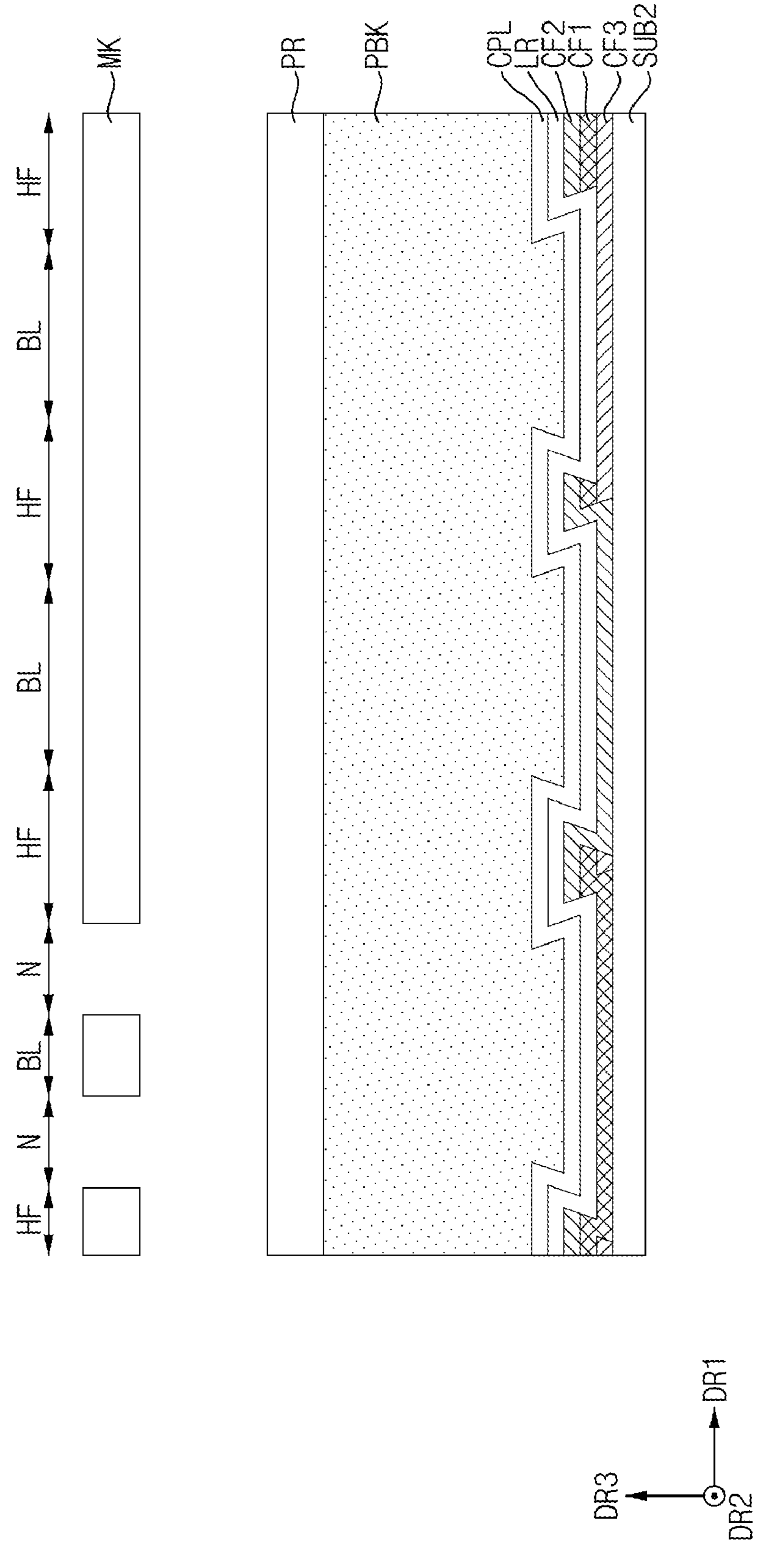

Referring to FIG. 8, a photoresist layer PR may be formed on the preliminary bank layer PBK. A mask MK may be disposed on the photoresist layer PR. The mask MK may include a transmission area N, a light blocking area BL, and a half-transmission area HF.

The light blocking area BL may be an area that completely blocks light directed to the photoresist layer PR on the mask MK. The transmission area N may be an area through which the light passes. The half-transmission area HF may be an area in which a smaller amount of light than the light passing through the transmission area N may be transmitted. The mask MK including the half-transmission area HF may be referred to as a half-tone mask.

However, the disclosure is not limited thereto, and the mask MK may be a slit mask or the like. For example, by including a slit area instead of the half-transmission area HF, a smaller amount of light than the light passing through the transmission area N may be transmitted.

The photoresist layer PR may undergo an exposure process and a development process. Accordingly, a photoresist pattern may be formed. The preliminary bank layer PBK may be etched using the photoresist pattern. The photoresist layer PR may be a positive photoresist or a negative photoresist. Hereinafter, for convenience of description, an embodiment in which the photoresist layer PR is a negative photoresist will be described.

Figure 9:
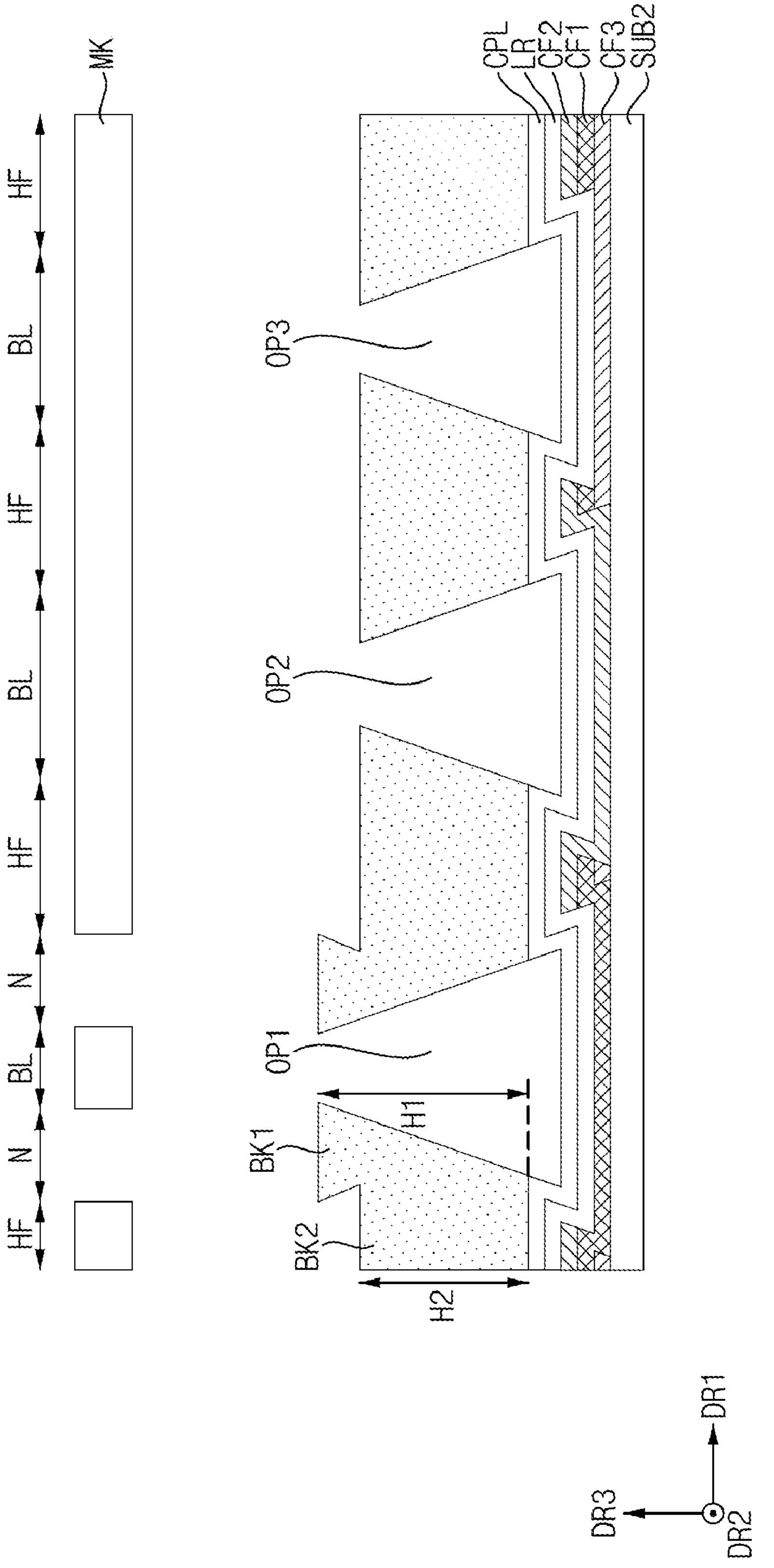

Referring to FIG. 9, each of the first to third openings OP1, OP2, and OP3 may be formed in a portion of the bank layer BK disposed in the light blocking area BL. Each of the first to third openings OP1, OP2, and OP3 may be formed in the portion of each of a first part BK1 and a second part BK2. The first part BK1 may be formed at a portion of the bank layer BK corresponding to the transmission area N. The second part BK2 may be formed at a portion of the bank layer BK corresponding to the half-transmission area HF. In an embodiment, a height (or thickness) H1 of the first part BK1 may be greater than a height (or thickness) H2 of the second part BK2 in the thickness direction.

Figure 10:
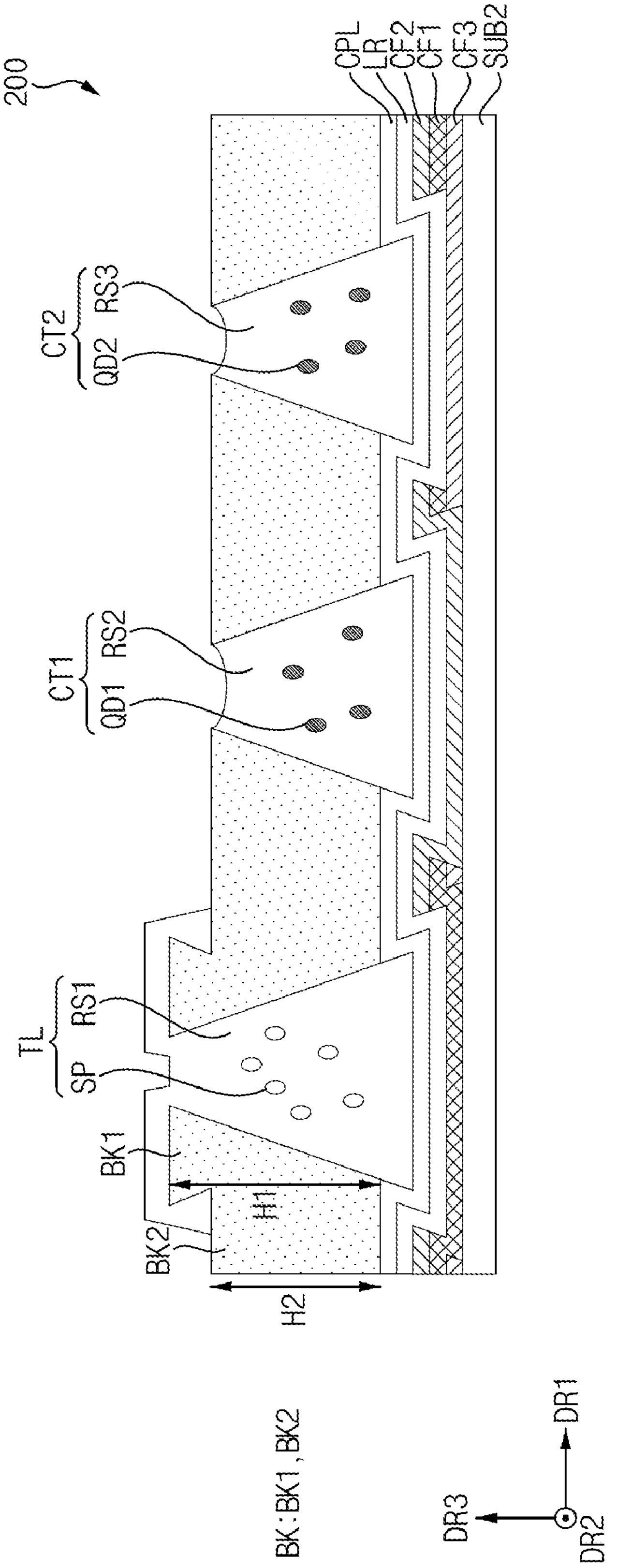

Referring to FIG. 10, a transmitting layer TL may be formed in the first opening OP1 (sec, e.g., FIG. 9). The transmitting layer TL may be formed on the capping layer CPL. In an embodiment, the transmitting layer TL may be formed to cover portions of upper surfaces of the first part BK1 and the second part BK2 (or lower surfaces of the first part BK1 and the second part BK2 in FIG. 2). The transmitting layer TL may include a first resin part RS1 and a scatterer SP. In an embodiment, the transmitting layer TL may be formed through an inkjet process and a photolithography process.

A first color conversion layer CT1 may be formed in the second opening OP2 (sec, e.g., FIG. 9). The first color conversion layer CT1 may be formed on the capping layer CPL. The first color conversion layer CT1 may include a second resin part RS2 and a first wavelength conversion particle QD1. In an embodiment, the first color conversion layer CT1 may be formed through an inkjet process.

A second color conversion layer CT2 may be formed in the third opening OP3 (see, e.g., FIG. 9). The second color conversion layer CT2 may be formed on the capping layer CPL. The second color conversion layer CT2 may include a third resin part RS3 and a second wavelength conversion particle QD2. In an embodiment, the second color conversion layer CT2 may be formed through an inkjet process.

The color filter part 200 manufactured according to FIGS. 4 to 10 may be combined with the display part 100 of FIG. 2 to form the display device DD of FIG. 2.

Figure 11:
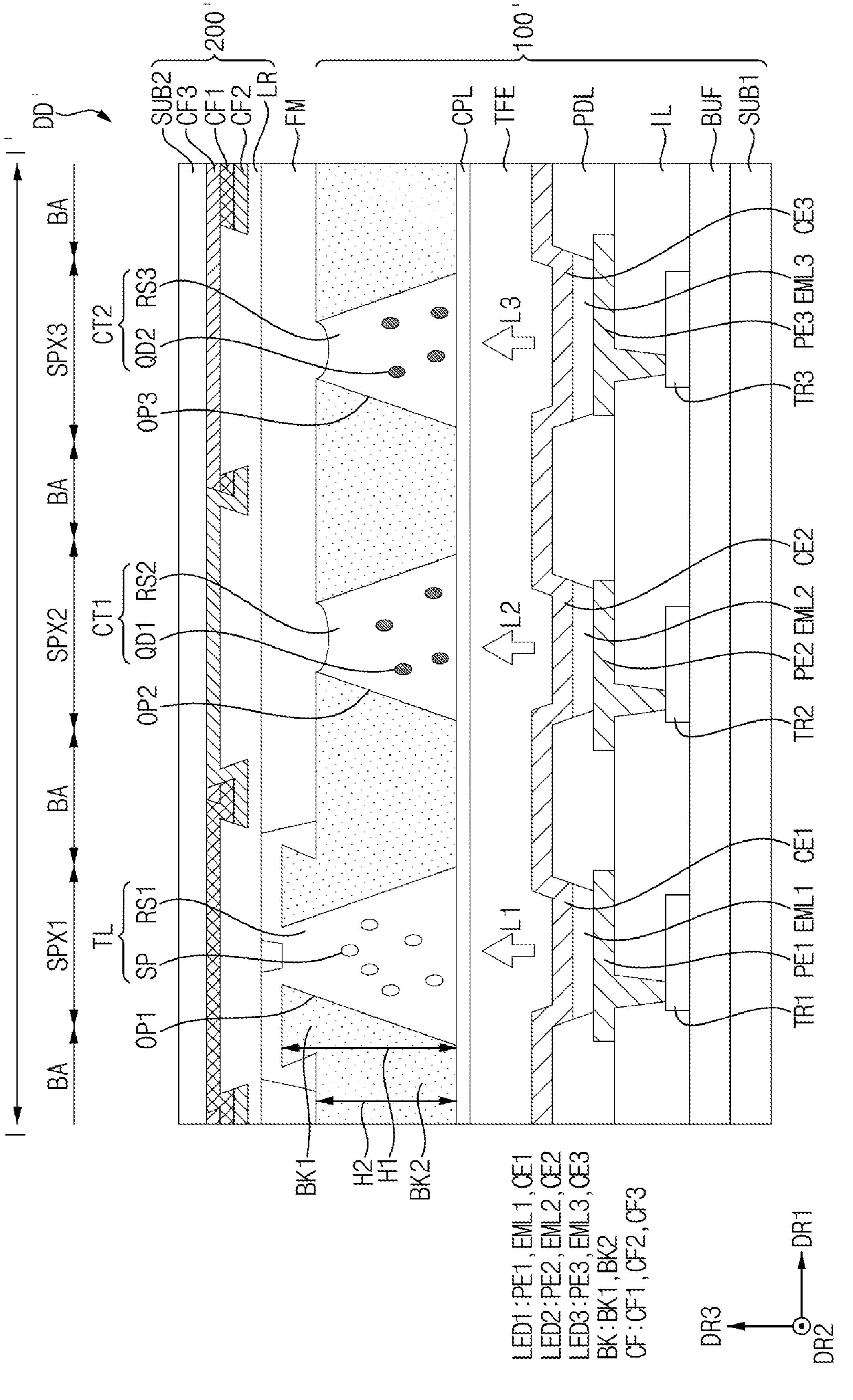
FIG. 11 is a schematic cross-sectional view illustrating a display device according to another embodiment.

FIG. 11 is a schematic cross-sectional view illustrating a display device according to another embodiment.

In describing a display device DD' of FIG. 11, substantially the same reference numerals as the display device DD of FIG. 2 may be assigned, and the detailed description thereof may be omitted.

Referring to FIGS. 3 and 11, a display device DD' according to another embodiment may include a display part 100', a color filter part 200', and a filler FM.

A display part 100' may include a first base substrate SUB1, a buffer layer BUF, an insulating layer IL, a pixel defining layer PDL, an encapsulation layer TFE, a capping layer CPL, a bank layer BK, a first pixel electrode PE1, a first light emitting layer EML1, a first common electrode CE1, a second pixel electrode PE2, a second light emitting layer EML2, a second common electrode CE2, a third pixel electrode PE3, a third light emitting layer EML3, a third common electrode CE3, a first transistor TR1, a second transistor TR2, and a third transistor TR3.

The bank layer BK may include a first part BK1 and a second part BK2. The first part BK1 may be disposed adjacent to (or around) the first opening OP1. For example, the first part BK1 may be disposed adjacent to the first opening OP1 and spaced apart from a first dummy opening DOP1 (see, e.g., FIG. 3) in the first direction DR1 and/or the second direction DR2.

The second part BK2 may be disposed adjacent to (or around) the first dummy opening DOP1. For example, the second part BK2 may be disposed between the first part BK1 and the first dummy opening DOP1.

In an embodiment, a height (or thickness) H1 of the first part BK1 may be greater than a height (or thickness) H2 of the second part BK2. The height H2 of the second part BK2 may be equal to a height (or thickness) of the bank layer BK (e.g., the second part BK2) disposed adjacent to (or around) the second opening OP2 and the third opening OP3.

The transmitting layer TL may be disposed inside the first opening OP1. For example, the transmitting layer TL may be disposed in the first light emitting area SPX1. For example, the transmitting layer TL may include a first resin part RS1 and a scatterer SP.

A surface of the first part BK1 facing the second base substrate SUB2 may be defined as an upper surface. In an embodiment, the transmitting layer TL may cover the upper surface of the first part BK1. A surface of the second part BK2 facing the second base substrate SUB2 may be defined as an upper surface. The transmitting layer TL may cover a portion of the upper surface of the second part BK2.

The first color conversion layer CT1 may be disposed inside the second opening OP2. For example, the first color conversion layer CT1 may be disposed in the second light emitting area SPX2. For example, the first color conversion layer CT1 may include a second resin part RS2 and a first wavelength conversion particle QD1. The second resin part RS2 and the first resin part RS1 may be substantially the same.

The first wavelength conversion particle QD1 may include quantum dot. The quantum dot may absorb the second incident light L2 to emit light having a wavelength. The wavelength of the light emitted from the quantum dot and a wavelength of the second incident light L2 may be different from each other. In an embodiment, the first wavelength conversion particle QD1 may absorb the second incident light L2 to emit red light.

The red light emitted from the first wavelength conversion particle QD1 may pass through the second base substrate SUB2 and be emitted to an outside (i.e., the third direction DR3). The second incident light L2, which is not converted by the first wavelength conversion particle QD1, may be blocked by the second color filter CF2. In an embodiment, the first color conversion layer CT1 may include a second scatterer (not shown).

The second color conversion layer CT2 may be disposed inside the third opening OP3. For example, the second color conversion layer CT2 may be disposed in the third light emitting area SPX3. For example, the second color conversion layer CT2 may include a third resin part RS3 and a second wavelength conversion particle QD2. The third resin part RS3 and the first resin part RS1 may be substantially the same. The third resin part RS3 and the second resin part RS2 may be substantially the same.

The second wavelength conversion particle QD2 may include quantum dot. The quantum dot may absorb the third incident light L3 to emit light having a wavelength. The wavelength of the light emitted from the quantum dot and a wavelength of the third incident light L3 may be different from each other. In an embodiment, the second wavelength conversion particle QD2 may absorb the third incident light L3 to emit green light.

The green light emitted from the second wavelength conversion particle QD2 may pass through the second base substrate SUB2 and be emitted to an outside (i.e., the third direction DR3). The third incident light L3, which is not converted by the second wavelength conversion particle QD2, may be blocked by the third color filter CF3. In an embodiment, the second color conversion layer CT2 may include a third scatterer (not shown).

A color filter part 200' may include a second base substrate SUB2, a color filter layer CF, and a low refractive layer LR. The color filter layer CF may include a first color filter CF1, a second color filter CF2, and a third color filter CF3.

The filler FM may be disposed between the display part 100' and the color filter part 200'. For example, the filler FM may serve to bond (or laminate) the display part 100' and the color filter part 200'.

Figure 12:
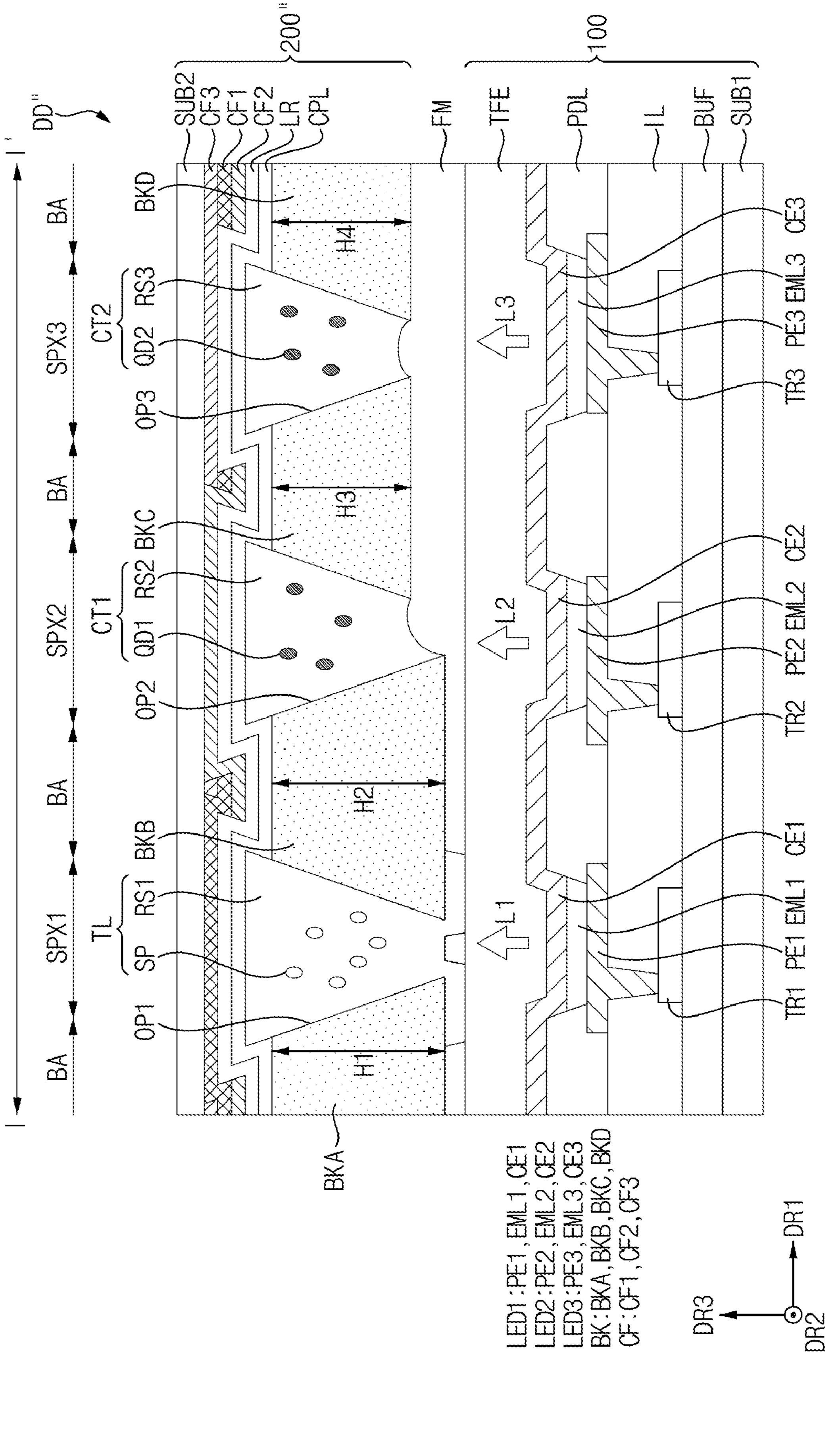
FIG. 12 is a schematic cross-sectional view illustrating a display device according to another embodiment.
Figure 13:
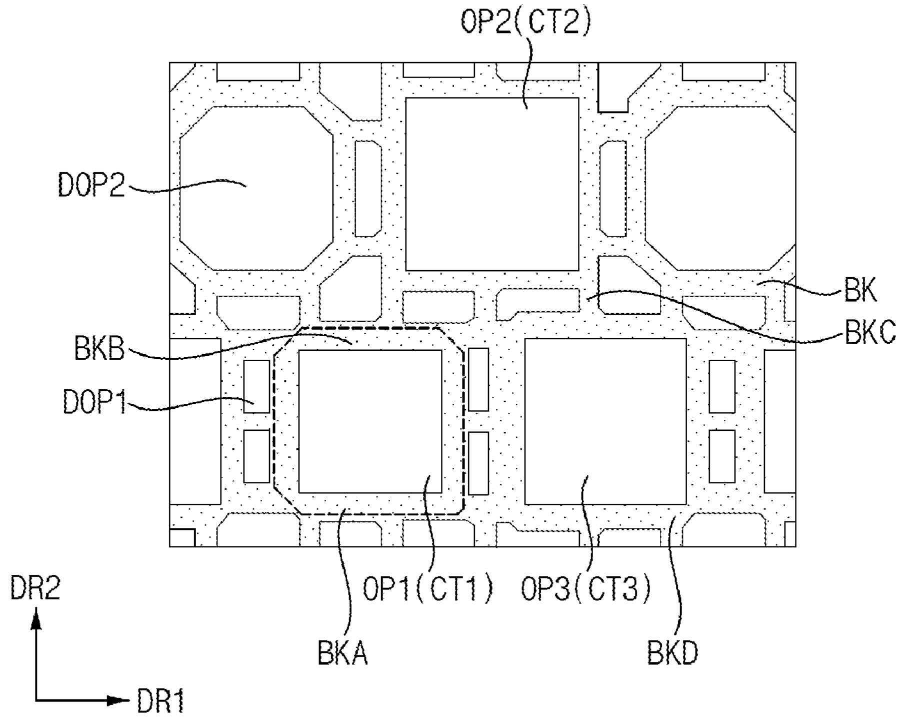
FIG. 13 is a schematic plan view illustrating a bank layer included in the display device of FIG. 12.

FIG. 12 is a schematic cross-sectional view illustrating a display device according to another embodiment. FIG. 13 is a schematic plan view illustrating a bank layer included in the display device of FIG. 12.

In describing a display device DD" of FIG. 12, substantially the same reference numerals as the display device DD of FIG. 2 may be assigned, and a detailed description thereof may be omitted.

Referring to FIGS. 12 and 13, a bank layer BK may be disposed under the capping layer CPL. The bank layer BK may include a first opening OP1, a second opening OP2, and a third opening OP3 overlapping the first light emitting area SPX1, the second light emitting area SPX2, and the third light emitting area SPX3 in a plan view, respectively. For example, the bank layer BK may be entirely disposed in the non-light emitting area BA and may have a matrix shape in a plan view.

In an embodiment, each of the first to third openings OP1, OP2, and OP3 may have a rectangular shape in a plan view. However, the disclosure is not limited thereto. For example, each of the first to third openings OP1, OP2, and OP3 may have one of a circular shape, a triangular shape, a pentagonal shape, and a hexagonal shape in a plan view.

The bank layer BK may include a first dummy opening DOP1 and a second dummy opening DOP2. Each of the first dummy opening DOP1 and the second dummy opening DOP2 may accommodate ink that is impregnated by mistake during manufacturing of first and second color conversion layers CT1 and CT2.

The bank layer BK may include a first area (or a first part) BKA and a second area (or a second part) BKB disposed adjacent to the first opening OP1. The second area BKB may be disposed between the first opening OP1 and the second opening OP2. The first area BKA may be spaced apart from the second area BKB with the first opening OP1 interposed between the first area BKA and the second area BKB in the first direction DR1 and/or the second direction DR2.

The bank layer BK may further include a third area (or a third part) BKC and a fourth area (or a fourth part) BKD disposed adjacent to the third opening OP3. The third area BKC may be disposed between the second opening OP2 and the third opening OP3. The fourth area BKD may be spaced apart from the third area BKC with the third opening OP3 interposed between the third area BKC and the fourth area BKD in the first direction DR1 and/or the second direction DR2.

A height (or thickness) H1 of the first area BKA and a height (or thickness) H2 of the second area BKB may be the same in the thickness direction. A height (or thickness) H3 of the third area BKC and a height (or thickness) H4 of the fourth area BKD may be the same in the thickness direction. In an embodiment, the height H1 of the first area BKA and the height H2 of the second area BKB may be greater than the height H3 of the third area BKC and the height H4 of the fourth area BKD.

Accordingly, a distance between the display part 100 and the color filter part 200" may be maintained constant by the first area BKA and the transmitting layer TL disposed in the first area BKA. For example, the first area BKA and the transmitting layer TL disposed in the first area BKA may serve as the column spacer.

Figure 14:
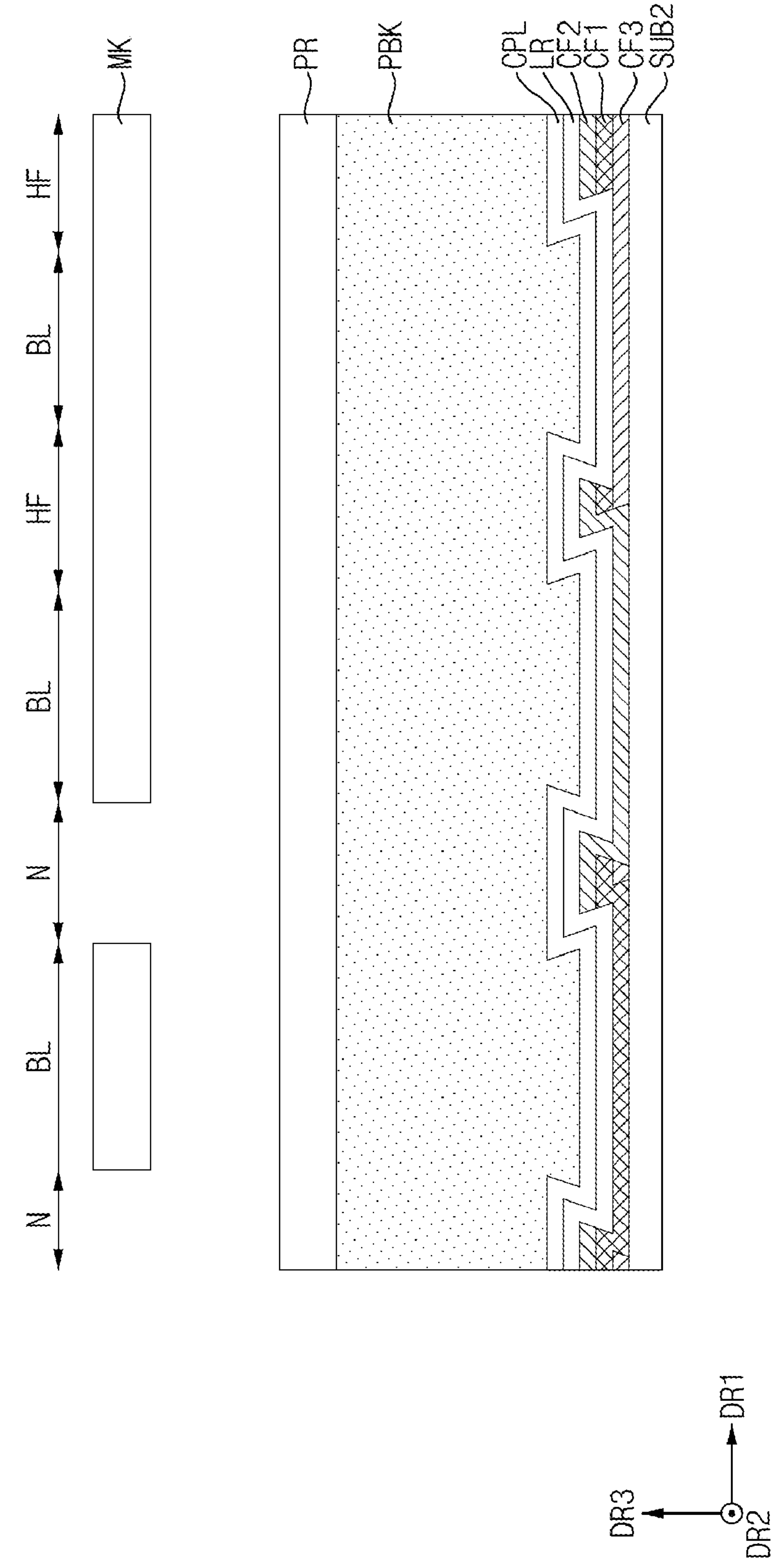
FIGS. 14 to 16 are schematic cross-sectional views illustrating a method of manufacturing a color filter part included in the display device of FIG. 12.
Figure 15:
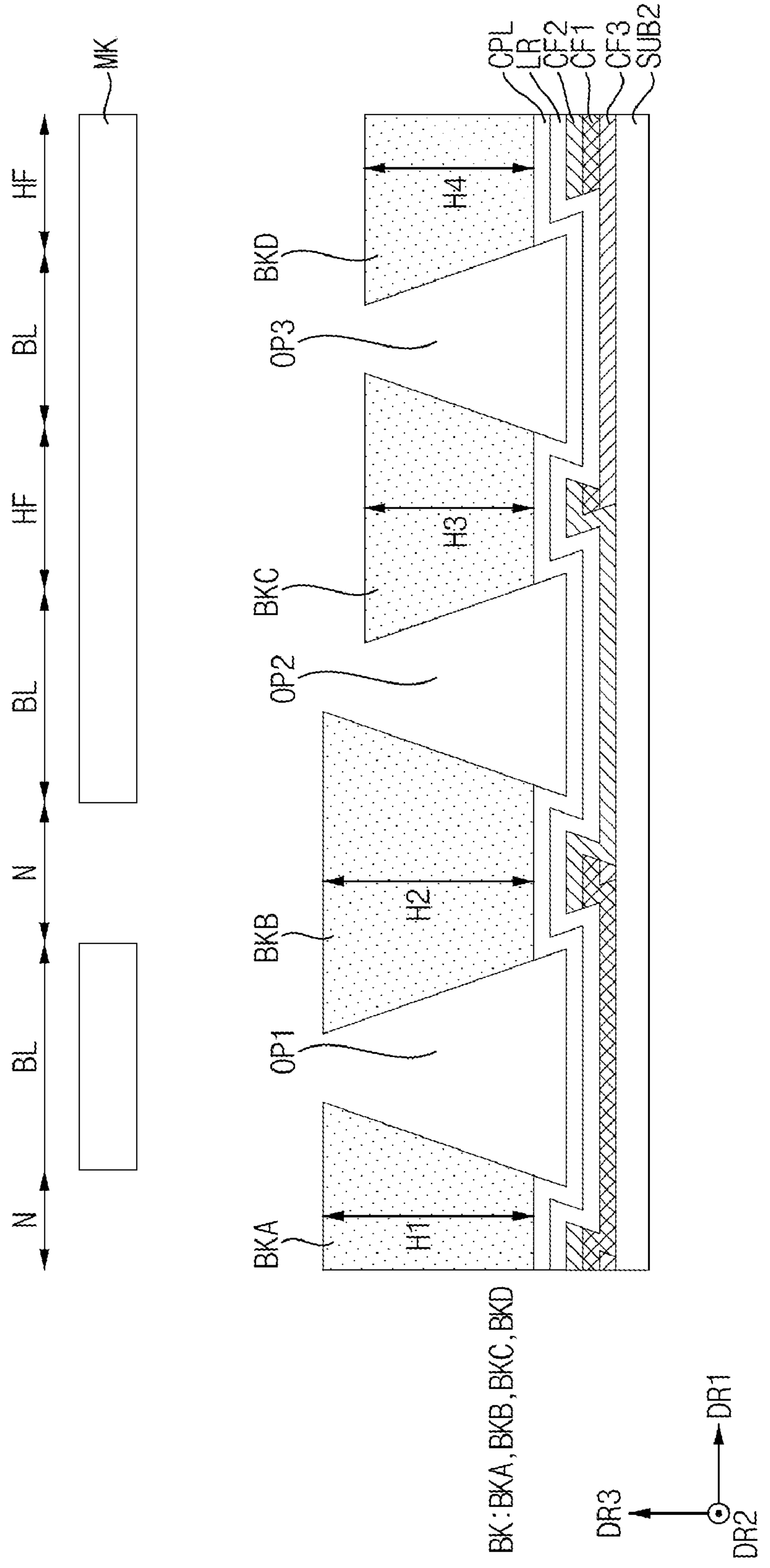
Figure 16:
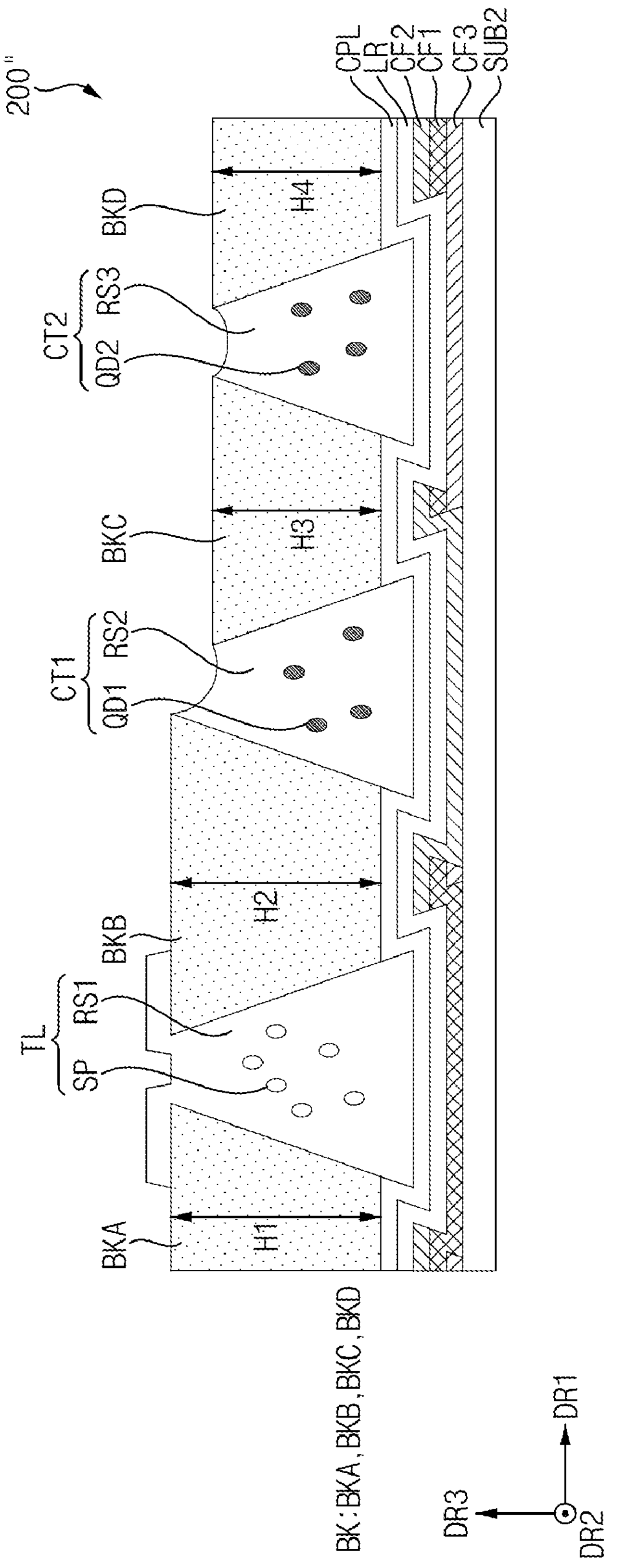

FIGS. 14 to 16 are schematic cross-sectional views illustrating a method of manufacturing a color filter part included in the display device of FIG. 12.

In describing a method of manufacturing the color filter part 200" included in the display device DD" according to another embodiment of FIGS. 14 to 16, substantially the same step as the method of manufacturing the color filter part 200 included in the display device DD of FIGS. 4 to 10 may be omitted.

Referring to FIG. 14, a photoresist layer PR may be formed on the preliminary bank layer PBK. A mask MK may be disposed on the photoresist layer PR. The photoresist layer PR may undergo an exposure process and a development process. Accordingly, a photoresist pattern may be formed. The preliminary bank layer PBK may be etched using the photoresist pattern. The photoresist layer PR may be a positive photoresist or a negative photoresist. Hereinafter, for convenience of description, an embodiment in which the photoresist layer PR is a negative photoresist will be described.

Referring to FIG. 15, Each of the first to third openings OP1, OP2, and OP3 may be formed in a portion of the bank layer BK corresponding to the light blocking area BL. Each of the first to third openings OP1, OP2, and OP3 may be formed in the portion of each of a first area BKA, a second area BKB, a third area BKC, a fourth area BKD. The first area BKA and the second area BKB may be formed at a portion of the bank layer BK corresponding to the transmission area N. The third area BKC and the fourth area BKD may be formed in a portion corresponding to the half-transmission area HF of the bank layer BK.

A height (or thickness) H1 of the first area BKA and a height (or thickness) H2 of the second area BKB may be formed to be equal. A height (or thickness) H3 of the third area BKC and a height (or thickness) H4 of the fourth area BKD may be formed to be equal. In an embodiment, the height H1 of the first area BKA and the height H2 of the second area BKB may be greater than the height H3 of the third area BKC and the height H4 of the fourth area BKD.

Referring to FIG. 16, a transmitting layer TL may be formed in the first opening OP1 (sec, e.g., FIG. 15). The transmitting layer TL may be formed on the capping layer CPL. In an embodiment, the transmitting layer TL may be formed to cover a portion of an upper surfaces of the first area BKA and the second area BKB (or a lower surfaces of the first area BKA and the second area BKB in FIG. 12). The transmitting layer TL may include a first resin part RS1 and a scatterer SP.

The first color conversion layer CT1 may be formed in the second opening OP2 (sec, e.g., FIG. 15). The first color conversion layer CT1 may be formed on the capping layer CPL. The first color conversion layer CT1 may include a second resin part RS2 and a first wavelength conversion particle QD1.

The second color conversion layer CT2 may be formed in the third opening OP3 (see, e.g., FIG. 15). The second color conversion layer CT2 may be formed on the capping layer CPL. The second color conversion layer CT2 may include a third resin part RS3 and a second wavelength conversion particle QD2.

Figure 17:
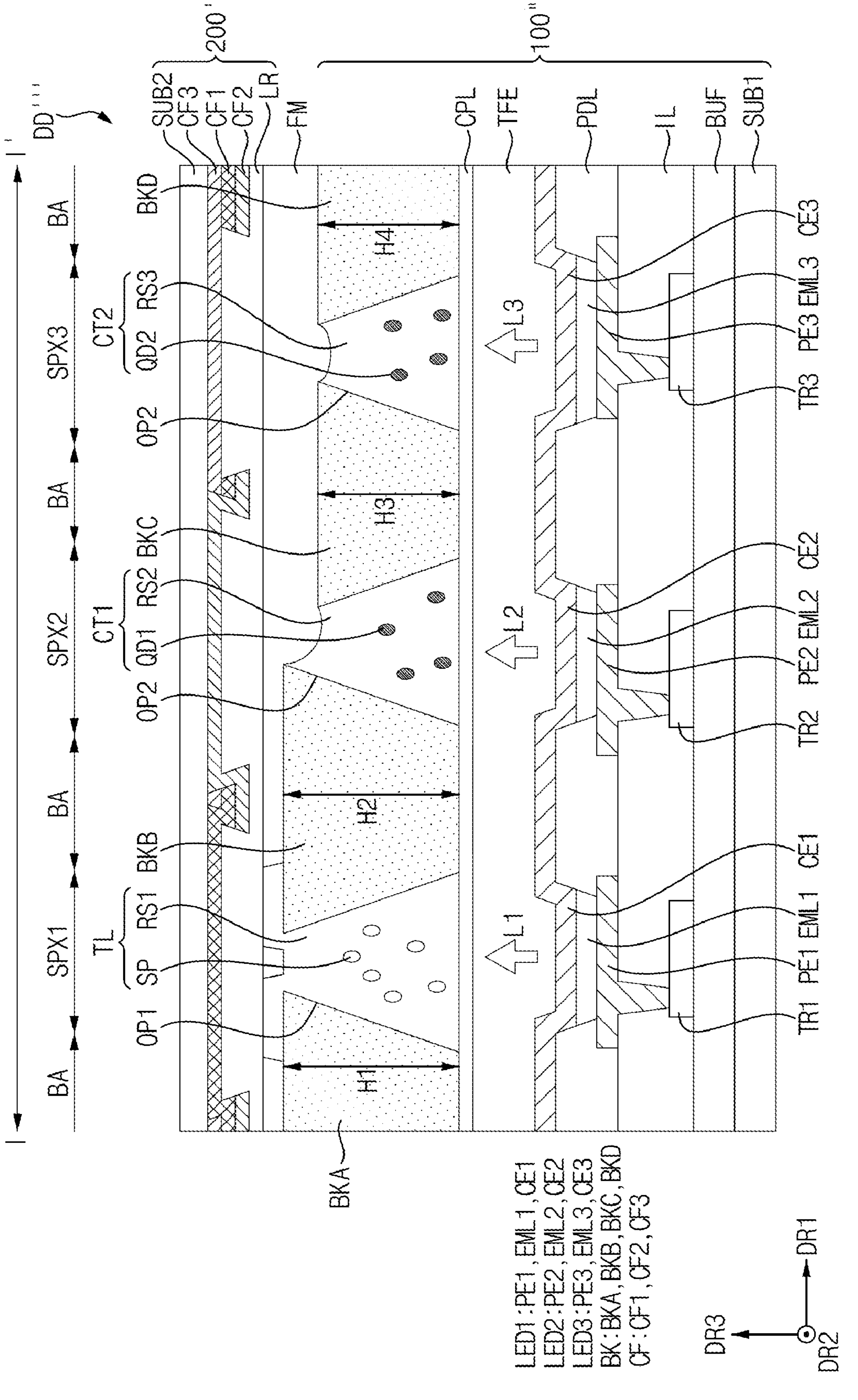
FIG. 17 is a schematic cross-sectional view illustrating a display device according to another embodiment.

FIG. 17 is a schematic cross-sectional view illustrating a display device according to another embodiment.

In describing a display device DD'" of FIG. 17, substantially the same reference numerals as the display device DD" of FIG. 12 may be assigned, and a detailed description thereof may be omitted.

Referring to FIGS. 13 and 17, a display device DD'" according to another embodiment may include a display part 100", a color filter part 200', and a filler FM.

A display part 100" may include a first base substrate SUB1, a buffer layer BUF, an insulating layer IL, a pixel defining layer PDL, an encapsulation layer TFE, a capping layer CPL, a bank layer BK, a first pixel electrode PE1, a first light emitting layer EML1, a first common electrode CE1, a second pixel electrode PE2, a second light emitting layer EML2, a second common electrode CE2, a third pixel electrode PE3, a third light emitting layer EML3, a third common electrode CE3, a first transistor TR1, a second transistor TR2, and a third transistor TR3.

The bank layer BK may include a first opening OP1, a second opening OP2, and a third opening OP3 overlapping the first light emitting area SPX1, the second light emitting area SPX2, and the third light emitting area SPX3 in a plan view, respectively. For example, the bank layer BK may be entirely disposed in the non-light emitting area BA and may have a matrix shape in a plan view.

In an embodiment, each of the first to third openings OP1, OP2, and OP3 may have a rectangular shape in a plan view. However, the disclosure is not limited thereto. For example, each of the first to third openings OP1, OP2, and OP3 may have one of a circular shape, a triangular shape, a pentagonal shape, and a hexagonal shape in a plan view.

The bank layer BK may include a first dummy opening DOP1 and a second dummy opening DOP2. Each of the first dummy opening DOP1 and the second dummy opening DOP2 may accommodate ink that is impregnated by mistake during manufacturing of first and second color conversion layers CT1 and CT2.

The bank layer BK may include a first area (or a first part) BKA and a second area (or a second part) BKB disposed adjacent to (or around) the first opening OP1. The second area BKB may be disposed between the first opening OP1 and the second opening OP2. The first area BKA may be spaced apart from the second area BKB with the first opening OP1 interposed between the first area BKA and the second area BKB in the first direction DR1 and/or the second direction DR2.

The bank layer BK may include a third area (or a third part) BKC and a fourth area (or a fourth part) BKD disposed adjacent to the third opening OP3. The third area BKC may be disposed between the second opening OP2 and the third opening OP3. The fourth area BKD may be spaced apart from the third area BKC with the third opening OP3 interposed between the third area BKC and the fourth area BKD in the first direction DR1 and/or the second direction DR2.

A height (or thickness) H1 of the first area BKA and a height (or thickness) H2 of the second area BKB may be the same in the thickness direction. A height (or thickness) H3 of the third area BKC and a height (or thickness) H4 of the fourth area BKD may be the same in the thickness direction. In an embodiment, the height H1 of the first area BKA and the height H2 of the second area BKB may be greater than the height H3 of the third area BKC and the height H4 of the fourth area BKD.

A color filter part 200' may include a second base substrate SUB2, a color filter layer CF, and a low refractive layer LR. The color filter layer CF may include a first color filter CF1, a second color filter CF2, and a third color filter CF3.

The filler FM may be disposed between the display part 100" and the color filter part 200'. For example, the filler FM may serve to bond (or laminate) the display part 100" to the color filter part 200'.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a first light emitting element diode and a second light emitting diode which are disposed on a first base substrate;

a bank layer disposed under a second base substrate facing the first base substrate, including a first opening overlapping the first light emitting diode in a plan view and a second opening overlapping the second light emitting diode in a plan view, and having a first part and a second part;

a transmitting layer disposed inside the first opening; and a first color conversion layer disposed inside the second opening, wherein a level of a lower surface of the first part and a level of a lower surface of the second part are different.

2. The display device of claim 1, wherein a thickness of the first part is greater than a thickness of the second part in the thickness direction.

3. The display device of claim 2, wherein the first part is disposed adjacent to the first opening.

4. The display device of claim 3, wherein the bank layer further includes a dummy opening, and the second part is disposed adjacent to the dummy opening.

5. The display device of claim 3, wherein the transmitting layer covers the first part and a portion of the lower surface of the second part.

6. The display device of claim 5, wherein the transmitting layer includes a scatterer.

7. The display device of claim 6, wherein the scatterer includes titanium dioxide ($TiO_2$).

8. The display device of claim 5, wherein the first color conversion layer includes a wavelength conversion particle.

9. The display device of claim 1, further comprising:

a color filter layer disposed under the second base substrate.

10. The display device of claim 9, further comprising:

a low refractive layer disposed between the color filter layer and the bank layer, and a capping layer disposed between the low refractive layer and the bank layer.

11. A display device comprising:

a first light emitting element diode and a second light emitting diode which are disposed on a first base substrate;

a bank layer disposed under a second base substrate facing the first base substrate, including a first opening overlapping the first light emitting diode in a plan view and a second opening overlapping the second light emitting diode in a plan view, and having a first part and a second part;

a transmitting layer disposed inside the first opening; and a first color conversion layer disposed inside the second opening, wherein a level of an upper surface of the first part and a level of an upper surface of the second part are different, and wherein the transmitting layer covers the first part and a portion of the upper surface of the second part.

12. A display device comprising:

a first light emitting diode, a second light emitting diode, and a third light emitting diode which are disposed on a first base substrate;

a bank layer disposed under a second base substrate facing the first base substrate, and including a first opening overlapping the first light emitting diode in a plan view, a second opening overlapping the second light emitting diode in a plan view, and a third opening overlapping the third light emitting diode in a plan view;

a transmitting layer disposed inside the first opening;

a first color conversion layer disposed inside the second opening; and a second color conversion layer disposed inside the third opening, wherein a level of a lower surface of the bank layer disposed adjacent to the first opening and a level of a lower surface of the bank layer disposed adjacent to the third opening are different from each other.

13. The display device of claim 12, wherein a thickness of the bank layer disposed adjacent to the first opening is greater than a thickness of the bank layer disposed adjacent to the third opening in a thickness direction of the second base substrate.

14. The display device of claim 13, wherein the transmitting layer covers a portion of the lower surface of the bank layer disposed adjacent to the first opening.

15. The display device of claim 14, wherein the transmitting layer includes a scatterer.

16. The display device of claim 15, wherein the scatterer includes titanium dioxide ($TiO_2$).

17. The display device of claim 15, wherein the first color conversion layer includes a first wavelength conversion particle, and the second color conversion layer includes a second wavelength conversion particle.

18. The display device of claim 12, further comprising:

a color filter layer disposed under the second base substrate.

19. The display device of claim 18, further comprising:

a low refractive layer disposed between the color filter layer and the bank layer.

20. The display device of claim 19, further comprising:

a capping layer disposed between the low refractive layer and the bank layer.

* * * * *